United States Patent [19]
Toth

[11] Patent Number: 4,977,375
[45] Date of Patent: Dec. 11, 1990

[54] FAN OPERATING STATUS SENSING CIRCUIT

[75] Inventor: Robert B. Toth, Ann Arbor, Mich.

[73] Assignee: Northern Telecom Limited, Montreal, Canada

[21] Appl. No.: 298,064

[22] Filed: Jan. 18, 1989

[51] Int. Cl.$^5$ ............................................. G01R 31/02
[52] U.S. Cl. .................................... 324/511; 324/510; 340/648
[58] Field of Search ............... 324/511, 510, 158 MG; 340/648, 664; 361/31, 33

[56] References Cited

U.S. PATENT DOCUMENTS 4,506,218  3/1985  Brown et al. ..................... 340/648 X

FOREIGN PATENT DOCUMENTS 3127372  1/1983  Fed. Rep. of Germany ...... 324/511
0055770  4/1983  Japan .................................. 324/511

Primary Examiner—Reinhard J. Eisenzopf
Assistant Examiner—Jack B. Harvey
Attorney, Agent, or Firm—Foley & Lardner, Schwartz, Jeffery, Schwaab, Mack, Blumenthal & Evans

[57] ABSTRACT

A direct current fan's status is monitored electronically using a current monitoring circuit. Normally, when a fan is running it exhibits a pulsating current input. The resulting alternating current signal is monitored via the current monitoring circuit to detect whether the fan is running or not.

11 Claims, 2 Drawing Sheets

FAN OPERATING STATUS SENSING CIRCUIT

FIELD OF THE INVENTION

This invention relates generally to current monitoring circuits. More specifically the present invention relates to a method for sensing fan failure using a current monitoring circuit.

BACKGROUND OF THE INVENTION

Circuits for determining the status of a fan are generally known. However, these circuits have often determined the status of a fan by conditions associated with, or created by, the fan and not by inspection of the fan itself. For instance, in heating systems the status of a fan is often determined by a circuit monitoring the ambient temperature of a chamber. Other systems may have circuits which monitor air flow. Although this may be satisfactory, depending on the use, the indication of a failure by such circuits may not be as a direct result of a fan failure. For instance, an air supply duct may be blocked thereby reducing the amount of air flow. A circuit designed to sense air flow would indicate this as a fault, however the fault would not be a result of a fan failure.

In electronic systems, fan failure is often detected by microswitches, which again sense air flow within the system. It has been found that these microswitches are unreliable as they are susceptible to mechanical malfunctions.

A method of directly monitoring a fan to determine its operating status would, consequently, be more accurate and more reliable.

SUMMARY OF THE INVENTION

The present invention electronically monitors the power input to a fan. It has been observed that when a D.C. fan is running, in normal operation, it exhibits a pulsating current input. By monitoring the resultant current input by means of an electronic circuit, the operating status of the fan may be readily obtained. This provides a more reliable method of fan failure detection than the fan failure detection means previously used.

Stated in other terms, the present invention is a method for sensing fan operating status using a current monitoring circuit, the method comprising the steps of: monitoring current flowing through a direct current fan and producing a first signal proportional to the magnitude of the current; amplifying the first signal to create a second signal; filtering the amplified signal to remove direct current components; clipping the resultant filtered signal to create current pulses; detecting the presence of the current pulses; discharging or charging a voltage storage means in response to the presence of the current pulses; comparing the voltage level of the voltage storage means to a voltage reference; and, providing an indication of the operating status of the fan.

Stated in yet other terms, the present invention is an apparatus comprising: a direct current fan; and a circuit for sensing fan operating status by current monitoring, the circuit comprising: a first resistor connected in series with a fan; an amplifier means connected to the resistor; a filter means responsive to the amplifier means; a clipping means connected to the filter means; a sensing means for sensing current from the filter means and the clipping means; a voltage storage means responsive to the sensing means; and, a comparison means for comparing the voltage levels of the voltage storage means and a voltage reference wherein the comparison means generates an indication of the operating status of the fan.

BRIEF DESCRIPTION OF THE DRAWINGS

The invention will be readily understood by the following description of a preferred embodiment, by way of example, in conjunction with the accompanying diagrammatic drawings, in which.

DETAILED DESCRIPTION OF THE INVENTION

Figure 1:
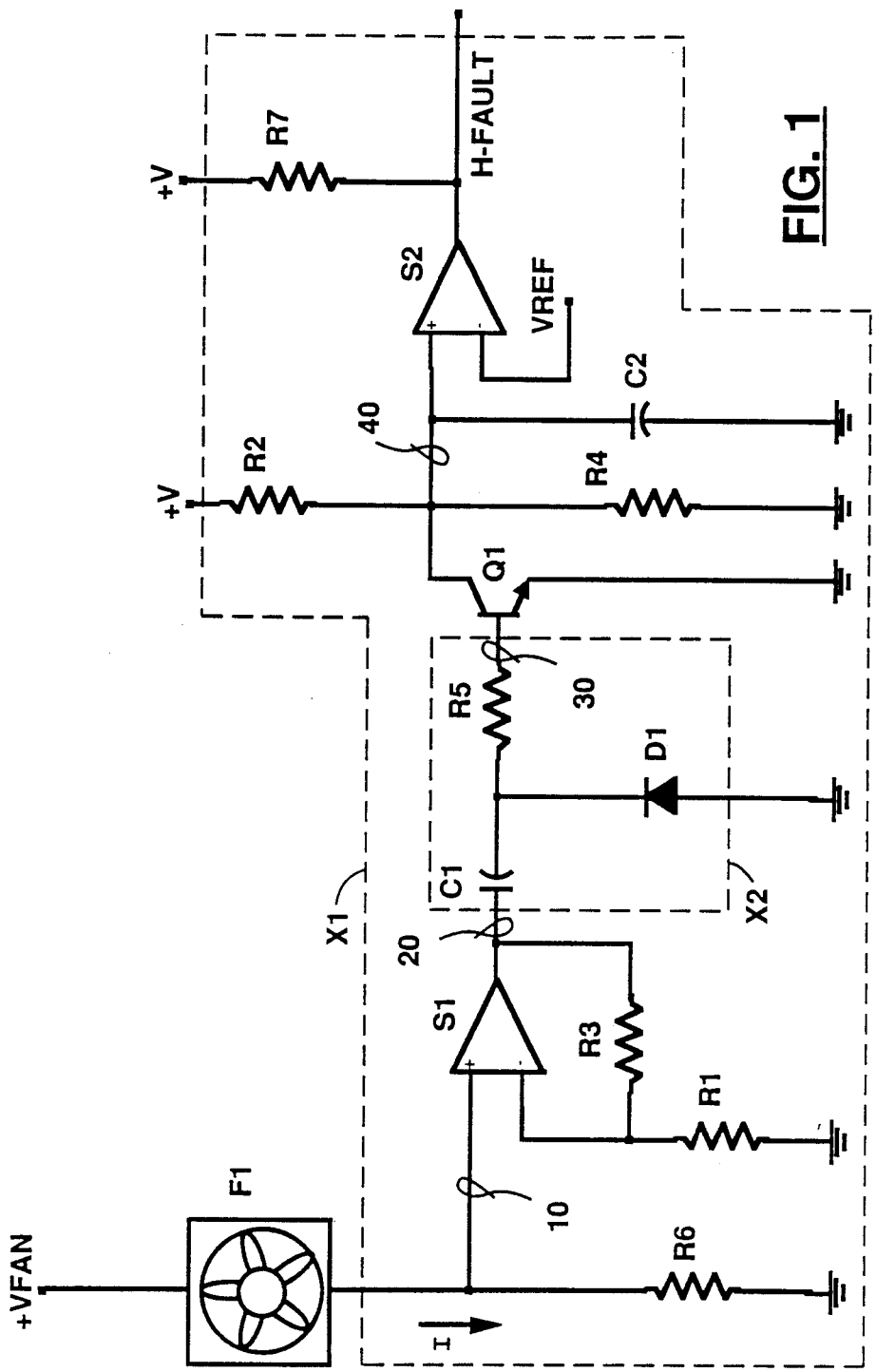
FIG. 1 is a schematic drawing of the current monitoring circuit of the present invention; and, FIGS. 2a-2d depicts waveforms useful for understanding the operation of the present invention.
Figure 2A:
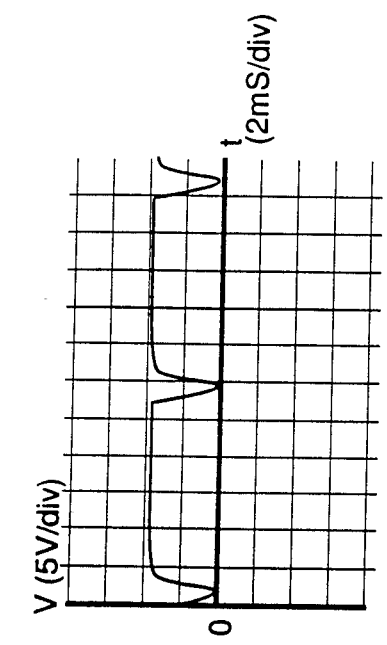
Figure 2B:
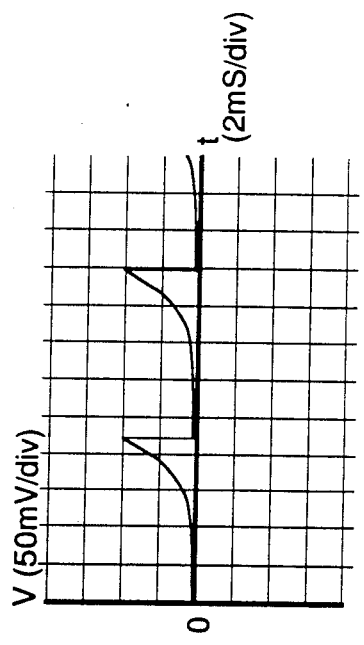
Figure 2C:
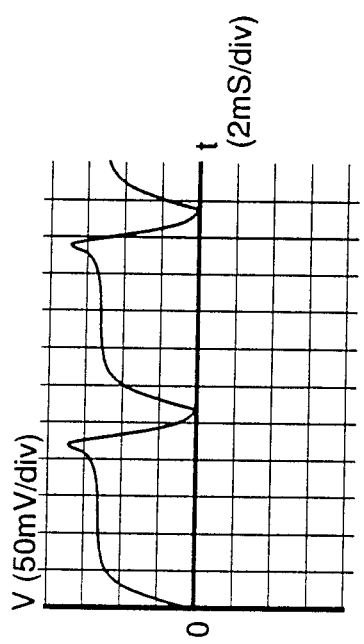
Figure 2D:
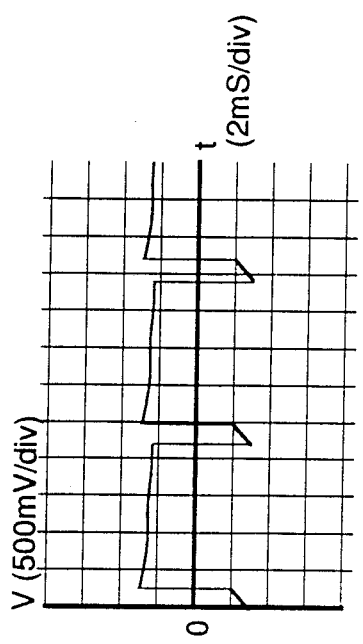

FIG. 1 is a simplified schematic drawing of the current monitoring circuit X1 of the present invention. The circuit is connected to the ground input of a direct current fan F1 which is powered from a direct current source +VFAN. A resistor R6 is provided to sense the amount of current I (as illustrated by FIG. 2a) flowing through the fan F1. The resultant signal 10 is fed into the positive input of an operational amplifier S1 which is part of the current monitoring circuit X1. The negative input of the operational amplifier S1 is connected to a resistor R1 and to a feedback resistor R3. The resistors R1, R3, and the operational amplifier S1, work together to amplify the current I detected by the resistor R6 by a factor determined by the value of resistor R3 divided by the value of resistor R1. The resultant amplified signal 20 (as illustrated by FIG. 2b) is fed to a conditioning circuit X2. Conditioning circuit X2 comprises a high pass filter network comprised of a capacitor C1 and a resistor R5 and a base clipping diode D1. The high pass filter is provided to eliminate a direct current signal which results if the fan F1 jams while operating. The diode D1 is provided to clip the resulting alternating signal from the operational amplifier S1 to create a current pulse. The resultant signal 30 (as illustrated by FIG. 2c) is fed into the base of a transistor Q1. When a current pulse is detected on the base of the transistor Q1, transistor Q1 turns "on" (as illustrated by FIG. 2d, as viewed from the collector of transistor Q1), thus discharging the capacitor C2. If the fan F1 stops functioning, a current pulse will not be detected on the base of the transistor Q1 and therefore the transistor Q1 will remain in an "off" state. In this instance, the capacitor C2 will charge to a voltage determined by the resistors R2 and R4 and the voltage source +V. The voltage at the capacitor C2, as represented by signal 40, is fed into the positive terminal of a comparator S2 which compares the voltage across the capacitor C2 with a reference voltage VREF which is connected to the negative terminal of the comparator S2. When the voltage across the capacitor C2 exceeds the voltage of the reference voltage VREF, the output H-FAULT of the comparator S2 will go high (logical 1), thus indicating that a fault has been detected with the fan F1. If a low (logical 0) output H-FAULT indication is desired, the connection to the capacitor C2 is connected to the negative input of the comparator S2 and the reference voltage VREF is connected to the positive input of the comparator S2. A resistor R7 is provided as a pull-up resistor to prevent a tri-state indication from the comparator S2.

In a preferred embodiment, the value of the various components, and voltages, are as follows:

| | |
|---|---|
| R6 | 1.0 ohms; |
| R1 | 1.0 K ohms; |
| R3 | 100 K ohms; |
| R5 | 1.0 K ohms; |
| R2 | 10 K ohms; |
| R4 | 10 K ohms; |
| R7 | 1.0 K ohms; |
| C1 | 0.47 μF; |
| C2 | 1.0 μF; |
| +V | +12.0 volts; |
| +VREF | +5.0 volts; |
| +VFAN | +24.0 volts. |

Numerous other modifications, variations, and adaptations may be made to the particular embodiments of the invention described above without departing from the scope of the claims.

What is claimed is:

1. A method for sensing fan operating status using a current monitoring circuit, said method comprising the steps of:
    (a) monitoring current flowing through a direct current fan and producing a first signal proportional to the magnitude of said current;
    (b) amplifying said first signal to create a second signal;
    (c) filtering and clipping said second signal to remove direct current components and to create current pulses;
    (d) detecting the presence of said current pulses;
    (e) discharging a voltage storage means in response to the presence of said current pulses; and,
    (f) comparing the voltage level of said voltage storage means to a voltage reference, thereby creating a third signal, said third signal providing an indication of the operating status of said fan.

2. The method as claimed in claim 1 wherein said third signal, created by said comparing step, is a logical 0 when said fan is operating normally, and is a logical 1, when said fan malfunctions.

3. An apparatus comprising:
    a direct current fan; and
    a circuit for sensing the operating status of said fan by current monitoring, said circuit comprising:
    a first resistor connected in series with said fan;
    an amplifier means connected to said resistor;
    a filter means responsive to said amplifier means;
    a clipping means connected to said filter means;
    a trigger means, responsive to said filter means and said clipping means, for discharging a voltage storage means; and
    a comparison means for comparing the voltage levels of said voltage storage means and a voltage reference wherein said comparison means generates an indication of the operating status of said fan.

4. An apparatus as claimed in claim 3 wherein said amplifier means comprises an operational amplifier having a positive input connected intermediate said first resistor and said fan, a negative input connected to a second resistor which is in turn connected to ground and said negative input further connected to a feedback resistor which is in turn connected to the output of said operational amplifier, the output of said operational amplifier further being connected to said filter means.

5. An apparatus as claimed in claim 3 wherein said filter means comprises a high pass filter comprising a first capacitor connected in series with a third resistor, said filter means being connected to said sensing circuit which comprises a transistor, said filter means further connected to a diode, which forms said clipping means, intermediate said capacitor and said third resistor.

6. An apparatus as claimed in claim 4 wherein said filter means comprises a high pass filter comprising a first capacitor connected in series with a third resistor, said filter means being connected to said sensing circuit which comprises a transistor, said filter means further connected to a diode, which forms said clipping means, intermediate said capacitor and said third resistor.

7. An apparatus as claimed in claim 3 wherein said voltage storage means comprises a second capacitor connected in parallel to a fourth resistor and connected in series to a fifth resistor which in turn is connected to a voltage source, said voltage storage means being connected to said comparison means intermediate said second capacitor and said fourth and fifth resistors.

8. An apparatus as claimed in claim 4 wherein said voltage storage means comprises a second capacitor connected in parallel to a fourth resistor and connected in series to a fifth resistor which in turn is connected to a voltage source, said voltage storage means being connected to said comparison means intermediate said second capacitor and said fourth and fifth resistors.

9. An apparatus as claimed in claim 5 wherein said voltage storage means comprises a second capacitor connected in parallel to a fourth resistor and connected in series to a fifth resistor which in turn is connected to a voltage source, said voltage storage means being connected to said comparison means intermediate said second capacitor and said fourth and fifth resistors.

10. An apparatus as claimed in claim 6 wherein said voltage storage means comprises a second capacitor connected in parallel to a fourth resistor and connected in series to a fifth resistor which in turn is connected to a voltage source, said voltage storage means being connected to said comparison means intermediate said second capacitor and said fourth and fifth resistors.

11. A method of monitoring the operation of a direct current fan comprising the steps of:
    monitoring a direct current supplied to the fan;
    detecting a pulsating current component of the direct current; and
    providing an indication of the operation of the fan in dependence upon a magnitude of the detected pulsating current component.

* * * * *